United States Patent [19]

Noda

[11] Patent Number: 5,187,379

[45] Date of Patent: Feb. 16, 1993

[54] FIELD EFFECT TRANSISTOR AND MANUFACTURING METHOD THEREFOR

[75] Inventor: Minoru Noda, Itami, Japan

[73] Assignee: Mitsubishi Denki Kabushiki Kaisha, Tokyo, Japan

[21] Appl. No.: 759,913

[22] Filed: Sep. 13, 1991

[30] Foreign Application Priority Data

Feb. 14, 1991 [JP] Japan .................................. 3-44244

[51] Int. Cl.$^5$ ................... H01L 29/80; H01L 21/265
[52] U.S. Cl. ................................. 257/192; 257/280; 257/655; 437/29; 437/41; 437/175; 437/911
[58] Field of Search ............... 357/15, 16, 22; 437/29, 437/41, 175, 911

[56] References Cited

U.S. PATENT DOCUMENTS

| 4,763,183 | 8/1988 | Ng ........................... 357/22 |
| 4,803,526 | 2/1989 | Terada et al. ............. 357/22 |
| 4,894,692 | 1/1990 | Noda et al. .............. 357/23.2 |
| 5,101,245 | 3/1992 | Shimura ................... 357/22 |

FOREIGN PATENT DOCUMENTS

| 61-187277 | 8/1986 | Japan . |
| 63-52479 | 3/1988 | Japan . |
| 112579 | 1/1989 | Japan . |
| 1225169 | 9/1989 | Japan . |
| 2105539 | 4/1990 | Japan . |
| 1507091 | 3/1975 | United Kingdom . |

OTHER PUBLICATIONS

"GaAs Integrated Circuits", edited by J. Mun, BSP Professional Books.
Ishida et al, "A 5 Gb/s 4 Bit Shift Register With 0.5 μm WNx-gate MESFETs", Conference on Solid States Devices and Materials, Japan, 1988, pp. 129-131.

Primary Examiner—Edward J. Wojciechowicz
Attorney, Agent, or Firm—Leydig, Voit & Mayer

[57] ABSTRACT

A field effect transistor includes a semi-insulating substrate, first conductivity type source and drain regions disposed in the substrate, a first conductivity type channel layer having a lower dopant concentration than the source and drain regions and disposed between and connecting the source and drain regions, and a second conductivity type buried region disposed in the substrate adjacent to and contacting the first conductivity type channel layer but not contacting the source and drain regions. The leakage current from the channel region is greatly reduced without increasing the parasitic gate capacitance.

12 Claims, 7 Drawing Sheets

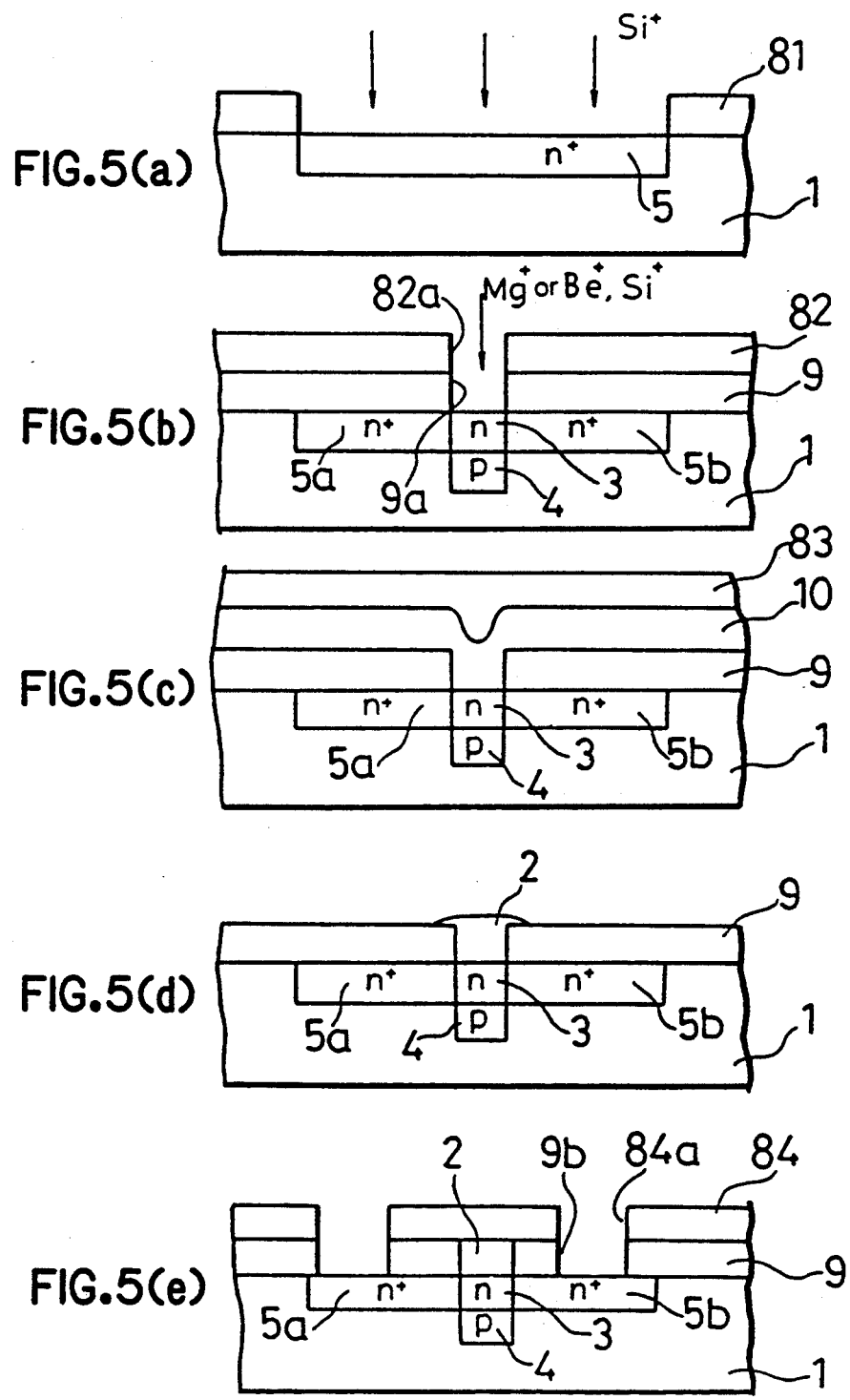

FIELD EFFECT TRANSISTOR AND MANUFACTURING METHOD THEREFOR

FIELD OF THE INVENTION

The present invention relates to a field effect transistor and a manufacturing method therefor and, more particularly, to a semiconductor layer structure under a channel region of a field effect transistor and a manufacturing method therefor.

BACKGROUND OF THE INVENTION

In conventional FETs, a structure in which a buried layer having a conductivity type opposite to that of an operating layer, is formed under the operating layer, including a channel layer, to reduce leakage current from the operating layer to the semi-insulating substrate has been proposed.

FIG. 8(a) is a cross-sectional view schematically showing the structure of a conventional self-aligned gate MESFET having a buried layer. In FIG. 8(a), reference numeral 1 designates a semi-insulating GaAs substrate. A gate electrode 2 is disposed on the substrate 1. N type high dopant concentration layers, i.e. n+ type source and drain regions, 5a and 5b are disposed at the opposite sides of gate electrode 2. An n type channel layer 3 is disposed directly under the gate electrode 2. A p type buried layer 11 is disposed under the n type high concentration layers 5a and 5b and surrounds these semiconductor layers 3, 5a, and 5b. Source and drain electrodes 6a and 6b are disposed on the n+ source and drain regions, respectively.

FIG. 8(b) shows an energy band structure in the depth direction in the channel region of a MESFET having the p type buried layer. In this structure, carriers (electrons) in the n type channel layer 3 are confined in the n type channel layer 3 because of the existence of a p-n junction barrier produced by the n type channel layer 3 and the p type buried layer 11, so that the leakage current to the substrate below the channel layer is reduced. Therefore, the short channel effect, for example a shift of threshold voltage $V_{th}$ toward negative side, is suppressed, resulting in MESFETs having high uniformity, high reproducibility and improved high-frequency characteristics.

As shown in FIG. 10(a), the threshold voltage $V_{th}$ varies depending on the thickness W of channel region C formed between the source S and the drain D. That is, the threshold voltage $V_{th}$ decreases with an increase in the thickness W. Therefore, when a leakage current flows, a current path is also formed below the channel region and then the effective thickness of channel region increases to $W_1$, resulting in a reduction of threshold voltage $V_{th}$. This phenomenon is the same as the above-described shift of threshold voltage $V_{th}$ toward negative side, which is one of various unfavourable phenomena, i.e., the short channel effect, occurring when the gate length $L_g$ is reduced. When a buried layer is formed below the channel layer, the leakage current is reduced and then the short channel effect is suppressed. As a result, deterioration in the high frequency characteristics of FET, i.e. the switching characteristics at high frequency of FET, are prevented.

It is difficult to suppress the variations in the thickness W of channel region C, and this is a problem in view of uniformity and reproducibility of FETs. However, when the buried layer is formed below the channel region, the buried layer prevents the channel region C from extending downward and keeps the thickness W constant, so that the uniformity and reproducibility of FETs are enhanced.

FIGS. 9(a) and 9(b) are cross-sectional views, respectively, showing other structures of conventional MESFETs having p type buried layers. The structure of FIG. 9(a) includes a p type buried layer 11a formed under the n+ source and drain regions 5a and 5b and the n type channel layer 3. The p type buried layer 11a does not cover the side surfaces of source and drain regions 5a and 5b, as only one difference from the structure of FIG. 8(a). In this structure, the leakage current from the bottom surfaces of high concentration n type regions 5a and 5b and channel layer 3 can be prevented, although a little leakage current is generated at the side surfaces of those regions 5a and 5b.

The structure of FIG. 9(b) includes a p type buried layer 11b formed below the n type channel layer 3. The p type buried layer 11b is only in contact with portions of bottom surfaces of n type high concentration regions 5a and 5b which is different from the structure of FIG. 8(a). In this structure, although the leakage current from the channel layer 3 to the substrate is prevented, the leakage current from the source and drain regions 5a and 5b to the substrate cannot be sufficiently suppressed.

In the above-described structures of conventional MESFETs, the p type buried layer formed below the n type channel layer is effective in suppressing the short channel effect. However, since the p type buried layer is in contact with the n type high concentration layers 5a and 5b with sufficiently larger area than the area of the n type channel layer, the gate parasitic capacitance increases due to the capacitance between the p type buried layer and the n+ type layers, whereby the operation speed of FET is reduced.

Japanese Published Patent Applications Nos. Hei.1-225169, Hei.2-105539, Sho.63-52479 and Sho.61-187277 disclose FETs in which the p type buried layer is only disposed directly under the channel layer so that the parasitic gate capacitance is not likely to increase.

However, the FET disclosed in Japanese Published Patent Application No. Hei.1-225169 is not a self-aligned gate FET and includes a recess groove at the center of an operating layer, a gate electrode disposed in the recess groove, and source and drain regions at opposite sides of the gate electrode. In such a structure, since the thickness of channel region is established depending on the depth of recess groove, the threshold voltage varies, resulting in poor uniformity and reproducibility of element characteristics. In addition, since this FET is not a self-aligned gate FET, a mask is required for ion implantation of the source and drain regions to increase the dopant concentrations of these regions in order to improve the element characteristics, i.e. conductivity, so that the manufacturing process is complicated.

In the FET disclosed in Japanese Published Patent Application No. Hei.2-105539, although a large portion of the lower surface of channel layer is covered by a p type buried layer, both side portions thereof are directly in contact with the substrate. Therefore, current leaks into the substrate through these portions, so that the leakage current in the channel region cannot be completely suppressed.

In the FETs disclosed in Japanese Published Patent Applications Nos. Sho.63-52479 and Sho.61-187277, a channel layer is formed at a shallower position in the substrate than the source and drain regions and the upper side surfaces of p type buried layer directly below the channel layer are in contact with the lower side surfaces of source and drain regions, whereby excessive parasitic capacitances are generated.

SUMMARY OF THE INVENTION

It is an object of the present invention to provide a self-aligned gate FET with reduced junction capacitance between the p type buried layer under the channel layer and the n+ type layers positioned at opposite of the channel layer, preventing leakage current flow from the channel layer to the substrate to a great extent and having good element characteristics.

It is another object of the present invention to provide a self-aligned gate FET with greatly reduced the leakage current from the channel layer to the source and drain regions without increasing the parasitic gate capacitance.

It is still another object of the present invention to provide a method for manufacturing a self-aligned gate FET in which the leakage current from the channel layer and parasitic gate capacitance are small, thereby ensuring a high production yield.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those of skill in the art from the following detailed description.

According to a first aspect of the present invention, a field effect transistor includes a semi-insulating substrate, first conductivity type source and drain regions in the substrate, a first conductivity type channel layer having lower dopant impurity concentration than that of the source and drain regions and disposed between the source and drain regions, and a second conductivity type buried layer disposed directly below the first conductivity type channel layer but not in contact with the source and drain regions. Therefore, the source to drain resistance is reduced, increasing the operation of the FET. In addition, the leakage current from the channel region is greatly reduced without increasing the gate parasitic capacitance.

According to a second aspect of the present invention, a field effect transistor includes a semi-insulating substrate, first conductivity type source and drain regions in the substrate, a first conductivity type channel layer disposed between the source and drain regions, a second conductivity type high concentration buried layer directly below the channel layer, and second conductivity type low concentration buried layers below said source and drain regions. Therefore, the leakage current from the channel layer and the source and drain regions can be greatly reduced while suppressing the junction capacitance between the source and drain regions and the buried layer.

According to a third aspect of the present invention, a field effect transistor includes a semi-insulating substrate, a first semiconductor layer formed on the substrate, a second semiconductor layer having a composition different from that of the first semiconductor layer and disposed on the first semiconductor layer, first conductivity type source and drain regions and a first conductivity type channel layer in the second semiconductor layer, and a second conductivity type high concentration buried layer in the first semiconductor layer directly under the channel layer. Therefore, the leakage current from the channel layer is completely prevented by the heterojunction barrier and the p-n junction barrier and the leakage current from the source and drain regions are greatly reduced by the heterojunction barrier.

According to a fourth aspect of the present invention, a field effect transistor includes a semi-insulating substrate, first conductivity type source and drain regions in the substrate, a first conductivity type channel layer between the source and drain regions, a second conductivity type high concentration buried layer directly below the channel layer, and isolation regions formed below the source and drain regions by ion implantation. Therefore, the leakage current from the channel layer and the source and drain regions are be greatly reduced without increasing the junction capacitance between the source and drain regions and the buried layer.

According to a fifth aspect of the present invention, a method for manufacturing a field effect transistor includes steps of forming a first conductivity type active layer and an insulating film successively on a semi-insulating substrate, forming an aperture at a predetermined portion of the insulating film, implanting second conductivity type dopant impurity ions using the insulating film as a mask to form a first conductivity type channel region having lower dopant concentration than the active layer in a predetermined portion of the active layer and to form a second conductivity type impurity layer below the channel region, forming a gate material on the entire surface of the insulating film to flatten the surface, and etching back the gate material to form a gate electrode self-alignedly on the channel region. Therefore, the buried layer and the gate electrode are formed self-alignedly with the channel region, so that a field effect transistor in which the leakage current from the channel layer and the parasitic gate capacitance are small and the source and drain resistance is low is produced in a relatively simple process at high reproducibility.

BRIEF DESCRIPTION OF THE DRAWINGS

FIGS. 5(a) to 5(e) are cross-sectional views of process steps in a method for manufacturing the MESFET of FIG. 1;

DETAILED DESCRIPTION OF THE PREFERRED EMBODIMENTS

Embodiments of the present invention will be described in detail with reference to the drawings.

Figure 1:
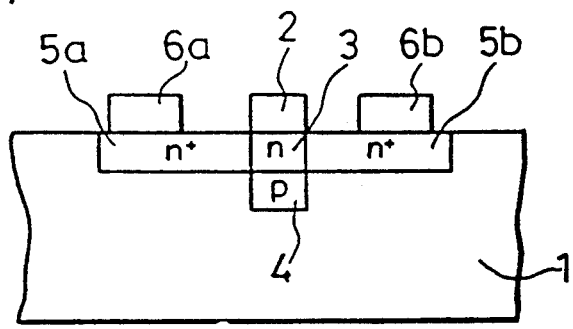
FIG. 1 is a cross-sectional view of a MESFET in accordance with a first embodiment of the present invention.

FIG. 1 is a cross-sectional view showing a structure of a MESFET in accordance with a first embodiment of the present invention. FIGS. 5(a) to 5(e) are cross-sectional views of steps in a method for manufacturing the MESFET of FIG. 1. In these figures, reference numeral 1 designates a semi-insulating GaAs substrate. A gate electrode 2 is disposed on a predetermined region of substrate 1. An n type channel layer 3 is disposed below the gate electrode 2. A high dopant concentration p type buried layer 4 is disposed directly below the n type channel layer 3. P type dopant impurities such as Mg or Be ions are implanted in the buried layer 4 to a relatively high concentration, for example $1-10 \times 10^{12}/cm^2$, so that the buried layer 4 is not completely depleted when it is in contact with the n type channel layer 3. N type high dopant concentration source and drain regions 5a and 5b having the same thickness as the n type channel layer 3 are disposed at opposite sides of the channel layer 3 so as not to be in contact with the p type buried layer 4. Source and drain electrodes 6a and 6b are disposed on the source and drain regions, respectively. Here, the dopant concentration of channel layer 3 is lower than those of the source and drain regions.

A description is given of the manufacturing method hereinafter.

A first resist film 81 is selectively formed on a semi-insulating GaAs substrate 1. Then, Si ions are implanted in the substrate 1 using the resist film 81 as a mask to form an n type high dopant concentration layer 5 (FIG. 5(a)).

After the first resist film 81 is removed, an insulating film 9 is formed on the entire surface and a second resist film 82 having an aperture 82a opposite the channel region in substrate 1 is formed on the insulating film 9. Then, the insulating film 9 is selectively removed using the resist film 82 as a mask to form an aperture 9a, and p type dopant impurities such as Mg ions or Be ions are implanted at a flux of about $1-10 \times 10^{12}/cm^2$ using the insulating film 9 and the resist 82 as a mask to form a p type buried layer 4 under the channel region. Thereafter, n type dopant impurities such as Si ions are implanted to control the carrier concentration in the channel region, thereby producing a channel layer 3. After removing the resist film 82, the substrate can be annealed to activate the implanted layers (FIG. 5(b)).

A refractory metal silicide (WSi$_x$) or an electrode metal 10 comprising such as a Ti layer and an Au layer is deposited on the entire surface and a third resist 83 is formed thereon to flatten the surface (FIG. 5(c)). Then, the resist 83 and the gate metal 10 are etched back by RIE (Reactive Ion Etching) or ion milling to form a self-aligned gate electrode 2 (FIG. 5(d)).

A fourth resist film 84 having a predetermined aperture pattern is formed on the substrate and then the insulating film 9 is selectively removed using this resist film 84 as a mask to form apertures 9b at the source and drain regions 5a and 5b (FIG. 5(e)). Then, source and drain electrodes are formed by the deposition and lift-off method, and the fourth resist film 84 and the insulating film 9 are removed, completing the structure of MESFET of FIG. 1.

In such a MESFET, since the p type buried layer 4 has relatively high dopant concentration, the energy barrier between the n type channel layer 3 and the p type buried layer 4 is high and steep. Since the p type buried layer 4 completely covers the lower surface of the n type channel layer 3, an energy barrier can be uniformly formed between the channel layer 3 and the substrate 1. Therefore, the charge carriers (electrons) leaking from the channel layer 3 to the substrate 1 are largely reduced and short channel effects are effectively suppressed. In addition, since the p type buried layer 4 directly under the n type channel layer 3 is deeper in the substrate than the n+ type layers 5a and 5b, the p type buried layer 4 is not in contact with the n+ type layers 5a and 5b. Therefore, parasitic gate capacitance due to the capacitance between the p type buried layer and the n+ type layers does not arise, whereby the operation speed of FET is enhanced. Since the n+ type layers 5a and 5b usually occupy a larger area in the substrate than the channel layer 3, the above-described reduction of parasitic capacitance is effective.

In the manufacturing method of this embodiment, the n+ type layer 5 is formed at the surface of substrate 1 and then p type impurity ions are selectively implanted using the mask (insulating film) 9, the n type channel layer 3 and the p type buried layer 4 are formed at the same time with high controllability. In addition, the concentration in channel layer 3 is automatically decreased with respect to the source and drain regions 5a and 5b.

In addition, since the gate electrode 2 is formed using the mask (insulating film) 9, the gate electrode 2 can be formed self-alignedly with the channel layer and the buried layer. As a result, a self-aligned gate FET having a buried layer can be formed in a relatively simple process with high reproducibility.

Figure 2:
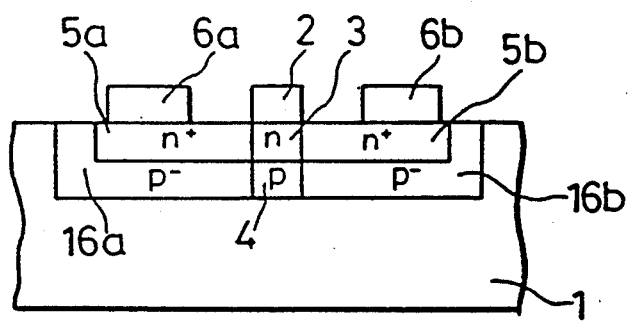
FIG. 2 is a cross-sectional view of a MESFET in accordance with a second embodiment of the present invention.

FIG. 2 is a cross-sectional view showing a structure of MESFET in accordance with a second embodiment of a the present invention. This structure includes low concentration p type buried layers 16a and 16b covering the bottom and side surfaces of n+ type layers 5a and 5b.

Figure 6A:
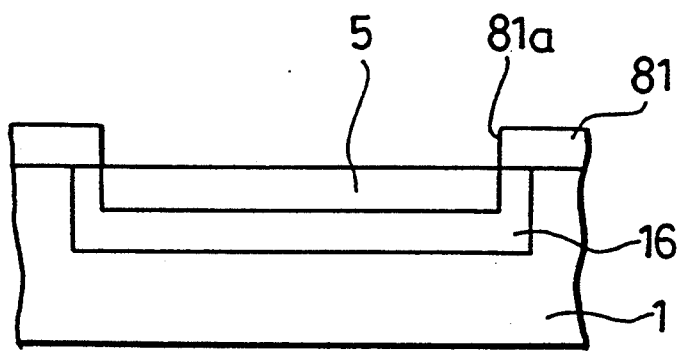
FIGS. 6(a) and 6(b) are cross-sectional views for explaining a method for manufacturing the MESFETs of FIGS. 2 and 4.

The manufacturing process will be described with reference to FIG. 6(a). A first resist film 81 having a predetermined aperture 81a is formed on a semi-insulating GaAs substrate 1. Then, Si ions are implanted into the substrate 1 using the resist film 81 as a mask to form an n type high concentration layer 5 and, thereafter, p type ions are implanted using the same mask to form a low concentration p type buried layer 16 (FIG. 6(a)). Thereafter, the structure of FIG. 2 is completed through the process steps shown in FIGS. 5(b) to 5(e).

In this second embodiment, the low concentration p type buried layers 16a and 16b completely prevent carriers (electrons) in the n+ type source and drain layers 5a and 5b from leaking into the substrate 1, with the result that the short channel effects are further suppressed as compared with the first embodiment. In addition, since the p type buried layers 16a and 16b have a low concentration of carriers, the parasitic capacitance in the n+ type layers 5a and 5b due to the p-n junction is small.

In the above illustrated embodiment, the mask 9 is used for both implantations of Si ions and p type impurities. However, the implantation of p type impurities can be performed using a mask formed by photolithography. In this case, the aperture pattern of the mask is not required to be precisely aligned with the n+ type layers 5a and 5b.

Figure 3:
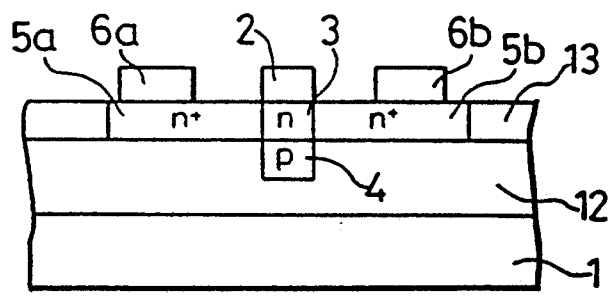
FIG. 3 is a cross-sectional view of a MESFET in accordance with a third embodiment of the present invention.

FIG. 3 is a cross-sectional view showing a structure of a MESFET in accordance with a third embodiment of the present invention. This structure includes an intrinsic AlGaAs layer 12 formed on the semi-insulating GaAs substrate 1 and a GaAs layer 13 producing a heterojunction with the AlGaAs layer 12. The n type channel layer 3 and the source and drain regions 5a and 5b are formed in the GaAs layer 13, and the p type buried layer 4 is formed in the AlGaAs layer 12 directly under the channel layer 3.

A method for manufacturing the structure of FIG. 3 is illustrated in FIGS. 7(a) to 7(d).

Figure 7A:
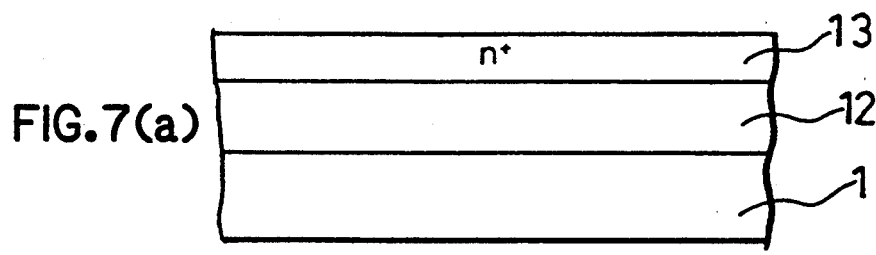
FIGS. 7(a) and 7(d) are cross-sectional views for explaining a method for manufacturing the MESFET of FIG. 3.
Figure 7B:
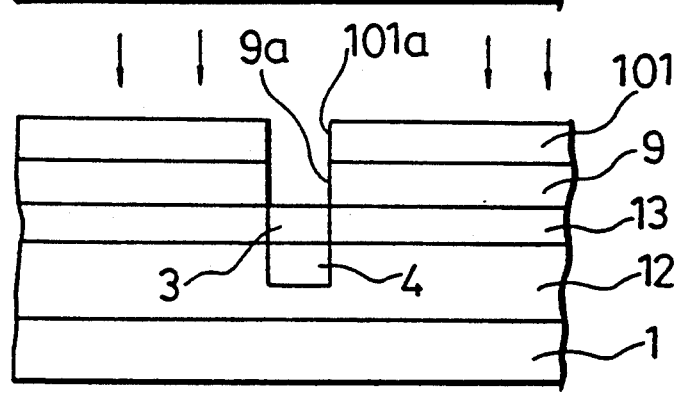

An intrinsic AlGaAs layer 12 and an n type GaAs layer 13 are epitaxially grown on the semi-insulating GaAs substrate 1 (FIG. 7(a)). Since these layers 12 and 13 are epitaxially grown, the heterojunction energy barrier formed therebetween is steeply sloped. Then, an insulating film 9 is formed on the entire surface of substrate 1 and a first resist film 101 having an aperture 101a corresponding to the channel region is formed thereon. Then, the insulating film 9 is selectively removed using the resist film 101 as a mask to form an aperture 9a. Then, Mg ions or Be ions are implanted in a flux of about $1 \sim 10 \times 10^{12}/cm^2$ using the insulating film 9 and the resist film 101 as a mask to form a p type buried layer 4 under the channel region. Since the p type buried layer 4 has relatively high concentration, the p-n junction barrier is high and steeply sloped. Thereafter, n type impurities such as Si ions are implanted to control the concentration in the channel region, thereby producing a channel layer 3 and source and drain regions 5a and 5b. Then, the substrate is annealed to activate the implanted layers (FIG. 7(b)).

Figure 7C:
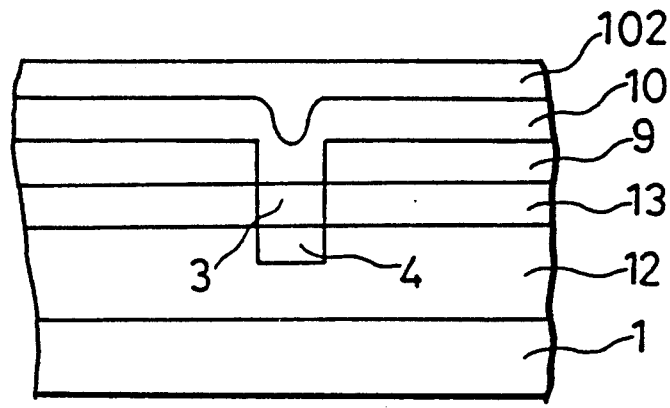
Figure 7D:
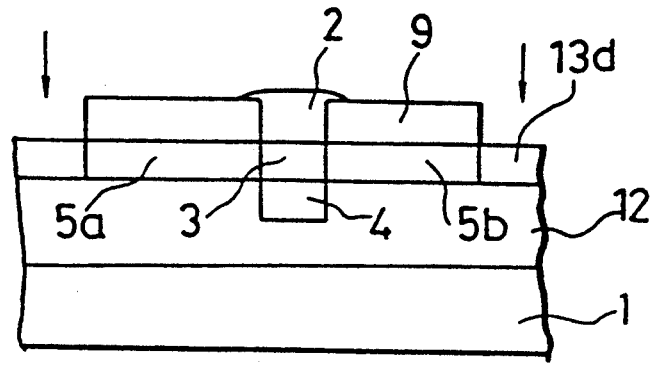
Figure 8A:
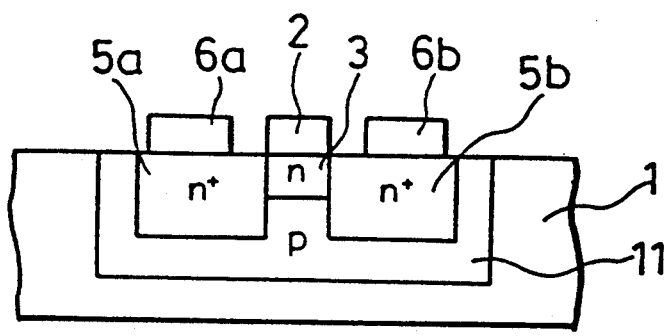
FIG. 8(a) is a cross-sectional view of a conventional MESFET having a p type buried layer and FIG. 8(b) is a diagram showing the energy band structure in a depth direction in the channel region of the MESFET of FIG. 8(a)
Figure 8B:
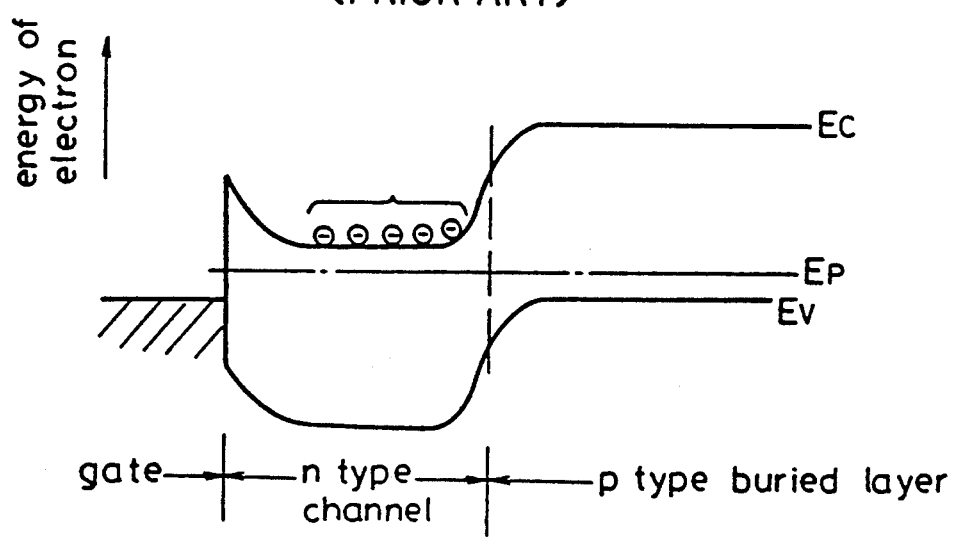
Figure 9A:
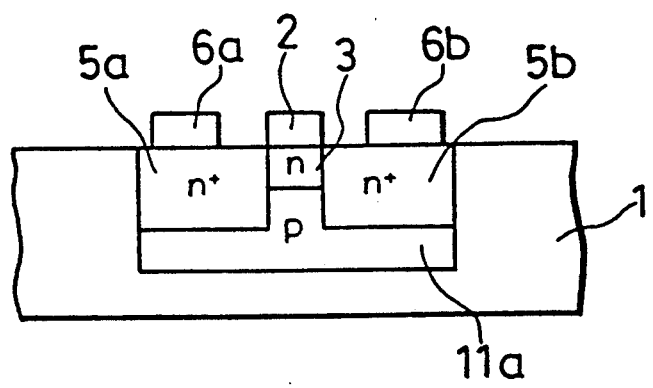
FIGS. 9(a) and 9(b) are cross-sectional views of other conventional MESFETs having a p type buried layer.
Figure 9B:
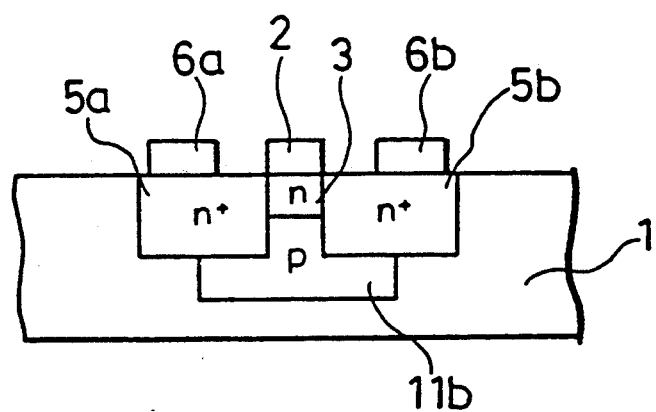
Figure 10A:
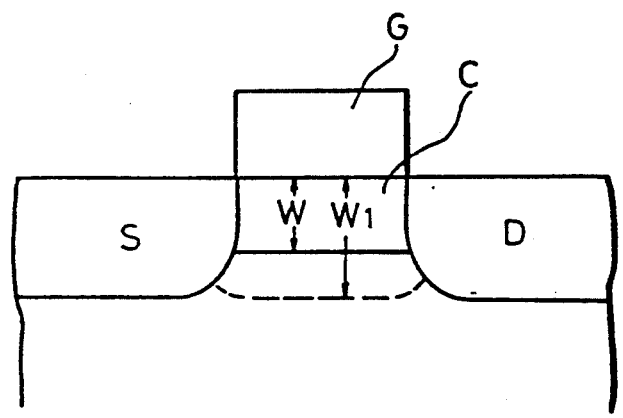
FIG. 10(a) is a cross-sectional view of a MESFET and FIG. 10(b) is a graph effects in the conventional MESFETs.
Figure 10B:
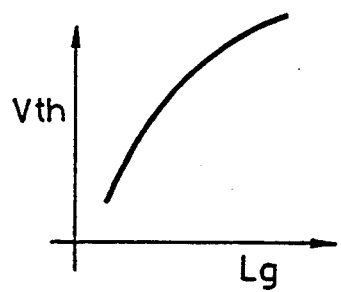

A refractory metal silicide (WSi$_x$) or an electrode metal 10 comprising a Ti layer and an Au layer is formed on the entire surface and then a second resist 102 is formed thereon to flatten the surface (FIG. 7(c)).

Then, the resist 102 and the gate metal 10 are etched back by RIE or ion milling to form a self-aligned gate 2. Thereafter, the insulating film 9 is etched away, leaving portions on the source and drain regions 5a and 5b. Proton or boron ions are implanted using the remaining insulating film 9 as a mask on the entrinsic GaAs layer 13d. (FIG. 7(d))

After the insulating film 9 is removed, source and drain electrodes 6a and 6b are formed by the deposition and lift-off method or the like, resulting in the MESFET structure of FIG. 3.

In this third embodiment, since heterojunction barriers are formed between the n type channel layer 3 and the p type buried layer 4 and between the n+ type source and drain regions 5a and 5b and the intrinsic AlGaAs layer 12, the leakage current from the channel layer 3 is efficiently prevented by the p-n junction barrier and the heterojunction barrier. In addition, the leakage current from the n+ type source and drain regions 5a and 5b to the substrate 1 is greatly reduced by the heterojunction barrier.

Figure 4:
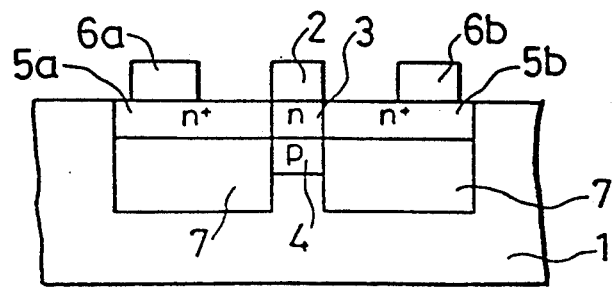
FIG. 4 is a cross-sectional view of a MESFET in accordance with a fourth embodiment of the present invention.

FIG. 4 is a cross-sectional view showing a structure of a MESFET in accordance with a fourth embodiment of the present invention. This structure includes insulating regions 7 formed under the n+ type layers 5a and 5b by implantation of proton or boron ions.

Figure 6B:
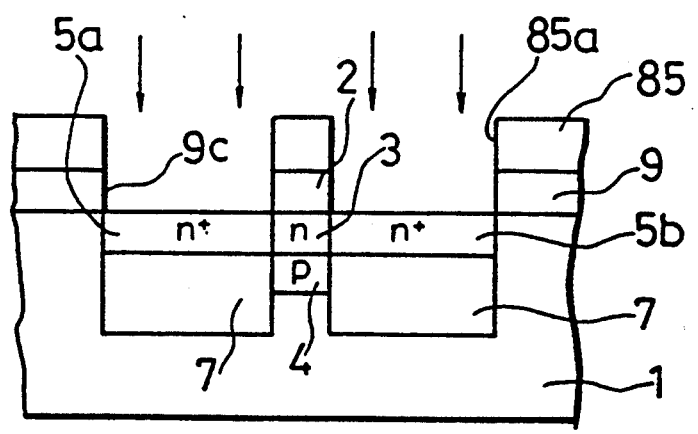

The manufacturing process will be described with reference to FIG. 6(b). First, source and drain regions 5a and 5b, a channel layer 3, a buried layer 4 and a gate electrode 2 are formed in accordance with the process steps shown in FIGS. 5(a) to 5(d). Then, a fifth resist film 85 is deposited on the entire surface and patterned to form apertures 85a on the source and drain regions 5a and 5b. Then, the insulating film 9 is selectively etched away using the fifth resist film 85 as a mask to form apertures 9c. Thereafter, proton or boron ions are implanted using the insulating film 9 and the fifth resist film 85 as a mask to form insulating regions 7 directly under the source and drain regions 5a and 5b (FIG. 6(b)).

After the insulating film 9 and the fifth resist film 85 are removed, source and drain electrodes 6a and 6b are formed by the deposition and lift-off method or the like, resulting in the MESFET of FIG. 4.

In this fourth embodiment, since the insulating regions 7 are formed under the n+ type source and drain regions 5a and 5b in the semi-insulating GaAs substrate 1, p-n junction capacitance is not produced in this region and the leakage current from the source and drain regions to the substrate is reduced.

Although a GaAs substrate is used in the above-illustrated first to fourth embodiments, other substrates, such as InP or Si, can be used.

Although a MESFET is described as a field effect transistor in the above-illustrated first to fourth embodiments, the present invention can be also applied to a MISFET such as a MOSFET or a JFET.

As is evident from the foregoing description, according to the present invention, since a buried layer having a conductivity type opposite to that of the channel layer is disposed below the channel layer but not in contact with the source and drain regions, the leakage current from the channel region is greatly reduced without increasing the parasitic gate capacitance.

In addition, according to the present invention, a high dopant concentration buried layer having a conductivity type opposite that of the channel layer is disposed directly under the channel layer, and low dopant concentration buried layers having a conductivity type opposite to that of the source and drain regions cover the source and drain regions. Therefore, the leakage current from the channel layer and the source and drain regions are greatly reduced while suppressing the junction capacitance between the source and drain regions and the buried layer.

In addition, according to the present invention, upper and lower semiconductor layers producing a heterojunction are disposed on a substrate. The channel layer and the source and drain regions are disposed in the upper semiconductor layer and a buried layer having a conductivity type opposite that of the channel layer is disposed in the lower semiconductor layer directly under the channel layer. Therefore, the leakage current from the channel layer is prevented by the heterojunction barrier and the pn junction barrier and the leakage current from the source and drain regions is greatly reduced by the heterojunction barrier.

In addition, according to the present invention, a buried layer having a conductivity type opposite to that of the channel layer is disposed directly under the channel layer and the regions under the source and drain regions are insulated by ion implantation. Therefore, the leakage current from the channel layer and the source and drain regions is greatly reduced without producing junction capacitance between the source and drain regions and the buried layer.

In addition, according to the manufacturing method of the present invention, impurity ions producing a conductivity type opposite to that of the active layer are implanted into a high dopant concentration active layer using an insulating film having a predetermined aperture as a mask to form a channel region and source and drain regions in the active layer and a buried layer under the channel region. Thereafter, a gate electrode is formed on the channel region using the insulating film as a mask. Therefore, the buried layer and the gate electrode are formed self-alignedly with the channel region. As a result, a field effect transistor in which the leakage current from the channel layer and the parasitic gate capacitance are small is formed in a simple process at high reproducibility.

What is claimed is:

1. A field effect transistor comprising:
a semi-insulating substrate having a surface;
first conductivity type source and drain regions having a dopant concentration and disposed in said substrate at said surface;
a first conductivity type channel layer having a dopant concentration lower than the dopant concentration of said source and drain regions disposed in said substrate at said surface between and connecting said source and drain regions;
a first second conductivity type buried region disposed in said substrate adjacent to and contacting said first conductivity type channel layer but not contacting said source and drain regions;
a gate electrode disposed on said surface and said channel layer opposite said buried region; and
a source electrode electrically contacting said source region and a drain electrode electrically contacting said drain region.

2. The field effect transistor of claim 1 wherein said first second conductivity type buried region has a relatively high dopant concentration and including a second second conductivity type buried region having a relatively low dopant concentration, lower than the dopant concentration of said first second conductivity type buried region, said second buried region being disposed in said substrate adjacent to and contacting said first buried region and surrounding said source and drain regions.

3. The field effect transistor of claim 2 wherein said first second conductivity type buried region is large enough that it is not completely depleted.

4. The field effect transistor of claim 1 comprising first and second electrically insulating isolation regions formed by ion implantation and disposed in said substrate adjacent to and contacting said source and drain regions, respectively.

5. The field effect transistor of claim 4 wherein said first second conductivity type buried region is large enough that it is not completely depleted.

6. A field effect transistor comprising:
a semi-insulating substrate;
a first semiconductor layer disposed on said substrate;
a second semiconductor layer having a different composition from and disposed on said first semiconductor layer, said second semiconductor layer having a surface;
first conductivity type source and drain regions disposed in said second semiconductor layer at said surface;
a first conductivity type channel layer disposed in said second semiconductor layer at said surface between and connecting said source and drain regions;
a second conductivity type relatively high dopant concentration buried region disposed in said first semiconductor layer adjacent to and contacting said channel layer but not contacting said source and drain regions;
a gate electrode disposed on said surface and said channel layer opposite said relatively high dopant concentration buried region; and
a source electrode electrically contacting said source region and a drain electrode electrically contacting said drain region.

7. The field effect transistor of claim 6 wherein said source and drain regions and said channel layer have respective dopant concentrations and said source and drain regions have higher dopant concentrations than said channel layer and said buried region is large enough that it is not completely depleted.

8. A method for manufacturing a field effect transistor comprising:
an element region production process for forming first conductivity type source and drain regions and a first conductivity type channel region in a semi-insulating substrate and for forming a second conductivity type buried region deeper in said substrate than said channel region, adjacent to, contacting, and self-aligned with said channel region comprising:
a first step of forming a first conductivity type active layer containing a first concentration of dopant impurities producing the first conductivity type and an insulating film successively on a semi-insulating substrate and forming an aperture in a predetermined region in said insulating film; and
a second step of implanting dopant impurities producing the second conductivity type in parts of said active layer and in said semi-insulating substrate using said insulating film as a mask to form a channel region in a predetermined part of said active layer containing the first concentration of said dopant impurities producing the first conductivity type and a lower concentration of dopant impurities producing the second conductivity type and a second conductivity type buried region in said semi-insulating substrate adjacent to, contacting, and self-aligned with said channel region; and
a gate electrode production process comprising:
forming a gate material on said insulating film to flatten the surface; and
etching said gate material to form a gate electrode self-alignedly on said channel region.

9. The method for manufacturing a field effect transistor of claim 8 wherein said first step in said element region production process comprises:
forming a first resist film on said semi-insulating substrate and patterning said first resist film to form an aperture;
implanting dopant ions using said first resist film as a mask to form said first conductivity type active layer; and
removing said first resist film and then forming an insulating film and patterning said insulating film to form an aperture at a position corresponding to said channel region of said active layer.

10. The method for manufacturing a field effect transistor of claim 8 wherein said first step in said element region production process comprises:
  forming a first resist film on said semi-insulating substrate and patterning said first resist film to form an aperture;
  implanting dopant ions producing the first conductivity type in said semi-insulating substrate using said first resist film as a mask to form said first conductivity type active layer and implanting dopant ions producing the second conductivity type using said first resist film as a mask to form a second conductivity type buried region having a lower dopant concentration than said first conductivity type active layer; and
  removing said first resist film and then forming said insulating film and patterning said insulating film to form the aperture at a position corresponding to said channel region of said active layer.

11. The method for manufacturing a field effect transistor of claim 8 wherein said first step in said element region production process comprises:
  successively epitaxially growing first and second first conductivity type semiconductor layers on said semi-insulating substrate, said second semiconductor layer having a smaller energy band gap than said first semi-conductor layer and forming said active layer; and
  forming an insulating film and patterning said insulating film to form the aperture at a position corresponding to said channel region of said active layer.

12. The method for manufacturing a field effect transistor of claim 9 wherein said gate electrode production process comprises:
  depositing a second resist film after etching said gate material and patterning said second resist film to form apertures at said source and drain regions;
  patterning said insulating film using said second resist film as a mask; and
  implanting isolation ions using said insulating film and said second resist film as a mask to form insulating regions in said substrate directly under said source and drain regions.

* * * * *